(12) United States Patent
Behle et al.

(10) Patent No.: US 7,434,537 B2
(45) Date of Patent: Oct. 14, 2008

(54) DEVICE FOR THE COATING OF OBJECTS

(75) Inventors: Stephan Behle, Gau-Odernheim (DE);
Lars Bewig, Bad Gandersheim (DE);
Thomas Küpper, Bad Gandersheim
(DE); Wolfram Maring, Hamburg (DE);
Christoph Mölle, Bad Gandersheim
(DE); Marten Walther, Engelstadt (DE)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 10/486,140

(22) PCT Filed: Aug. 7, 2002

(86) PCT No.: PCT/EP02/08852

§ 371 (c)(1),
(2), (4) Date: Aug. 13, 2004

(87) PCT Pub. No.: WO03/015122

PCT Pub. Date: Feb. 20, 2003

(65) Prior Publication Data

US 2005/0005853 A1    Jan. 13, 2005

(30) Foreign Application Priority Data

Aug. 7, 2001 (DE) .................... 101 38 693

(51) Int. Cl.
C23C 16/00 (2006.01)
C23F 1/00 (2006.01)
H01L 21/306 (2006.01)

(52) U.S. Cl. .............. 118/723 MW; 118/723 MR; 118/723 MA; 156/345.36; 156/345.41; 156/345.42

(58) Field of Classification Search ......... 118/723 MW; 156/345.36, 345.41, 345.42
See application file for complete search history.

(56) References Cited

U.S. PATENT DOCUMENTS

| 4,951,602 | A | * | 8/1990 | Kanai ........................ 118/719 |
| 4,984,534 | A | * | 1/1991 | Ito et al. ............. 118/723 MW |
| 5,053,678 | A |   | 10/1991 | Koike et al. ............ 315/111.81 |
| 5,103,182 | A | * | 4/1992 | Moslehi ...................... 324/642 |
| 5,202,095 | A |   | 4/1993 | Houchin et al. ............. 422/186 |

(Continued)

FOREIGN PATENT DOCUMENTS

DE    41 36 297.7    5/1993

(Continued)

OTHER PUBLICATIONS

"Plasma Properties in the Open-Ended Region of a Coaxial-Type Microwave Cavity", 1991 American Institute of Physics, Rev. Sci. Instrum. 62(1991) June, No. 6, New York, US, pp. 1498-1503.

*Primary Examiner*—Parviz Hassanzadeh
*Assistant Examiner*—Rakesh K Dhingra
(74) *Attorney, Agent, or Firm*—Ohlandt, Greeley, Ruggiero & Perle, L.L.P.

(57)    ABSTRACT

An apparatus for coating objects having a single microwave source, two or more coating chambers, and an impedance structure or a waveguide structure. The coating chambers are connected to the single microwave source. The impedance structure or waveguide structure divides the microwave energy in order to generate plasmas in the coating chambers.

25 Claims, 8 Drawing Sheets

U.S. PATENT DOCUMENTS

| | | | |
|---|---|---|---|
| 5,236,511 A * | 8/1993 | Etzkorn et al. | 118/723 MW |
| 5,311,103 A * | 5/1994 | Asmussen et al. | 315/111.81 |
| 5,324,361 A * | 6/1994 | Etzkorn et al. | 118/719 |
| 5,749,966 A * | 5/1998 | Shates | 117/79 |
| 5,874,706 A * | 2/1999 | Ishii et al. | 219/121.43 |
| 6,463,874 B1 * | 10/2002 | Dotter et al. | 118/723 MW |
| 6,488,889 B1 * | 12/2002 | Stahlecker et al. | 422/22 |

FOREIGN PATENT DOCUMENTS

| | | |
|---|---|---|
| DE | 195 03 205.5-33 | 7/1996 |
| DE | 689 26 923.4 | 12/1996 |
| JP | 58088086 | 5/1983 |
| JP | 61220486 | 9/1986 |
| JP | 2001/192840 | 7/2001 |

* cited by examiner

DEVICE FOR THE COATING OF OBJECTS

BACKGROUND OF THE INVENTION

1. Field of the Invention

The invention relates to an apparatus for coating objects by means of vapor deposition. Coating process chambers are connected to a microwave device.

2. Description of Related Art

Examples of suitable objects include optical objects, such as for example reflectors which are to form part of lamps, but also bottles or vials for use in the pharmaceutical or chemical industry. However, these are merely examples of a wide range of practical applications.

DE 689 26 923 T2 has disclosed a microwave ion source in which plasma chambers having a plurality of coaxial lines are connected to a coaxial line of a microwave generator. The plasma chambers are in this case in communication with one another, and consequently the electromagnetic fields in the individual chambers have an influence on one another. An ion beam emerges from each plasma chamber of the microwave ion source, with a large-area ion beam being generated by the interaction of the plasma chambers.

DE 195 03 205 C1 relates to an apparatus for generating plasma in a reduced-pressure vessel with the aid of alternating electromagnetic fields, with a conductor in rod form being guided through the reduced-pressure vessel inside a tube made from insulating material.

DE 41 36 297 A1 describes an apparatus for the local generation of plasma by means of microwave excitation. In this case, a tube made from insulating material, which acts as a boundary with respect to the reduced-pressure region and inside which there is an inner conductor made from metal, is provided in a treatment chamber; the microwaves from a microwave source are introduced into the inner conductor. This known apparatus makes use of the effect whereby a type of coaxial line which transmits the microwave is formed at the outer wall of the carrying waveguide by virtue of the properties of the ionized gas.

Numerous demands are imposed on apparatuses of this type. The coating result has to satisfy the requirements for example with regard to the uniformity of the layer thickness and the reproducibility from object to object. Furthermore, the installation should have the maximum possible yield of objects per unit time. The energy consumption should be as low as possible.

These demands are not met or are not met in full by the known apparatuses.

SUMMARY OF THE INVENTION

The invention is based on the object of configuring an apparatus of the type described in the introduction, comprising a microwave source and coating chambers, in such a manner that for a defined investment cost it is possible to achieve a higher production capacity than hitherto, that the energy consumption is lower than in known apparatuses, and that space is saved.

This object is achieved by the features of claim 1.

Accordingly, the basic idea of the invention consists in providing a single microwave source to supply two or more coating chambers, rather than just one as was previously the case. The basic idea consists in dividing and introducing the microwave energy in order to generate the plasma for the coating in separate chambers by using suitable impedance or waveguide structures.

In a first embodiment of the invention, the microwave energy is divided in the waveguide itself. Suitable waveguide components, such as for example y-dividers, can be used for this purpose. The microwave energy which has been divided in the waveguide component is then introduced into the respective coating chamber, for example through dielectric windows or coaxial conductor structures. Any form of waveguide, for example rectangular waveguides or circular waveguides, is conceivable. Another embodiment of the invention consists in dividing the microwave energy in an impedance structure, comprising for example coaxial conductor structures.

The microwave source is particularly advantageously operated in pulsed mode for PICVD operation. This can be implemented, for example, by pulsed energy supply. However, by way of example, an unpulsed, time-modulated microwave source or a corresponding energy supply is also possible. In both cases, the plasma intensity is modulated. This allows gas exchange at a relatively low plasma intensity, in particular during the interpulse periods in PICVD operation, and reduces the thermal load.

In a particularly preferred embodiment, the energy of the single microwave source is introduced into the respective coating chamber by means of a coaxial conductor structure having a metallic inner conductor and a dielectric as outer conductor. When the energy is introduced in this way, it is particularly advantageous to provide means which allow the electrical length of the individual coaxial conductors to be altered. This measure makes it possible for the impedance of one conductor branch, in the case of two or more coating chambers, to be influenced in such a manner that a plasma is ignited in both or all of the conductor branches. To achieve this, the impedance is to be selected, for example by varying the electrical length of the individual coaxial conductors, in such a way that all the coating stations receive the same energy supply. Alternating ignition or ignition of a plasma in individual chambers is to be avoided by suitable impedance selection.

The coating chambers are advantageously arranged separately from one another. In particular, the chambers are shielded from one another, so that the plasmas in the chambers and the electromagnetic fields cannot have any influence on one another. It is preferable that, in each of the coating chambers, one object which is to be coated is accommodated. Alternatively, it is preferable a coating chamber (10, 10') is in each case formed by an object which is to be coated.

In the case of coaxial conductors, the impedances can be varied by altering the length of the individual conductors which is surrounded by the dielectric.

Further configurations of the invention will emerge from the subclaims and the appended description.

BRIEF DESCRIPTION OF THE DRAWINGS

The invention is explained in more detail with reference to the drawing, in which, in detail.

DETAILED DESCRIPTION OF THE INVENTION

Figure 1:
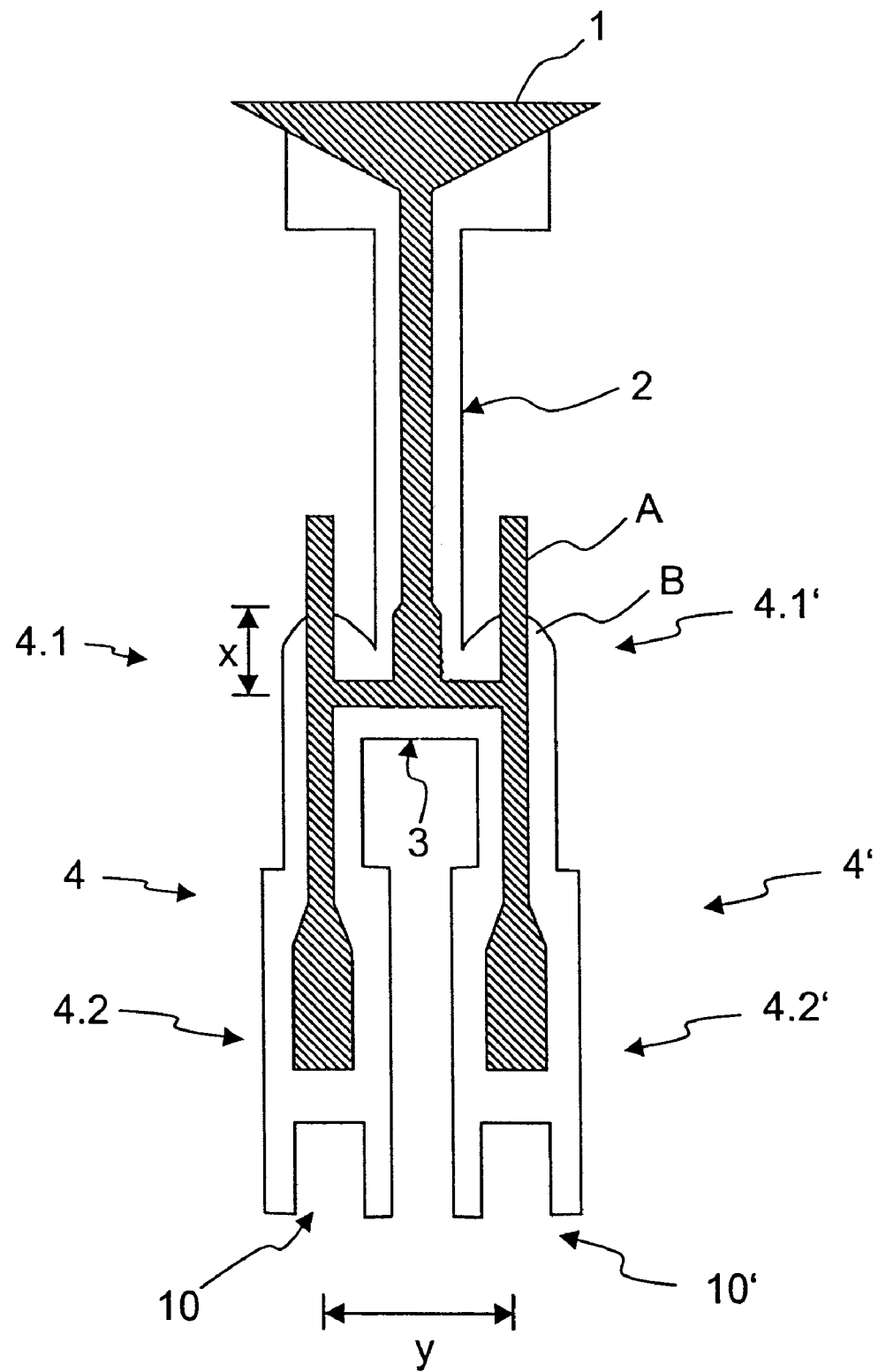
FIG. 1 diagrammatically depicts an excerpt from a PICVD coating installation, in which the microwave energy is divided by means of an impedance structure.

FIG. 1 illustrates a first embodiment of the invention, in which the microwave energy from the single microwave source is divided in the impedance branch.

The apparatus illustrated in FIG. 1 reveals an upper region, to which a microwave source (not shown here) is connected, while the lower region comprises the coating chambers. In this case, the apparatus comprises a coaxial structure, comprising an inner conductor A and an outer conductor B. The inner conductor A consists of metal and the outer conductor B is a dielectric, in the present case an air gap. The dielectric is delimited by a metallic surface. In the context of the invention, a dielectric is to be understood as meaning a nonmetallic medium or a non-metallically-conducting medium. Accordingly, in the context used here, the term dielectric also encompasses a medium, such as for example air or vacuum.

In the present case, two treatment chambers 10, 10' are provided and are supplied by the single microwave source. In this case, the coating chambers are formed from the substrates themselves, for example from glass vials, each of which is assigned a gas nozzle (not shown), or alternatively in each case one substrate, for example for external coating, is accommodated in one of the chambers. The substrates to be treated are preferably of the same type. As an alternative to glass vials or bottles, consideration may also be given to plastic vials or bottles or reflectors.

The geometric structure of the above mentioned coaxial conductor structure is configured as follows:

a cone 1 is connected to the microwave source MwQ (not shown in more detail). This cone is used to form a transition from a rectangular waveguide (not shown here) to the above mentioned coaxial conductor structure.

A conductor 2 is connected to the cone 1. An H-shaped conductor structure adjoins the conductor 2. This H-shaped conductor structure comprises a web 3 and two limbs 4, 4'. The two limbs are in turn composed of an upper limb section 4.1 and a lower limb section 4.2 or an upper limb section 4.1' and a lower limb section 4.2'.

The supply conductors to the coating chambers, or the impedance structure, in particular the conductor 2 and the H-shaped conductor structure, are designed as fixed or rigid conductors. This produces a defined position of the conductors, so that the conduction and dividing of the electromagnetic energy cannot be influenced by movement of the conductors.

The dimension x, which will be dealt with in more detail below, is important. This dimension denotes the section of the length of the limb section 4.1 or 4.1' which is surrounded by the dielectric B.

A further important dimension is the distance y between the lower limb sections 4.2, 4.2', i.e. the distance between them in the region of the treatment chambers 10, 10'. The inventors have discovered that by suitably selecting the above mentioned parameters x and y it is possible to adjust the conditions in the process chambers (coating chambers) so that any quality differences from chamber to chamber can be eliminated and a coating quality which is acceptable can be achieved on all substrates.

Therefore, the system of the invention makes it possible to provide a double coating station or a multiple coating station, so that the production yield can be greatly increased and production costs can be extensively minimized. In particular the energy costs can be reduced as a result. The quality of the coating can be optimized.

In this context, it should be emphasized that of the two parameters x and y mentioned, it is possible that only one will have to be altered in order to perform an adjustment. Parameter x is particularly important.

Figure 2:
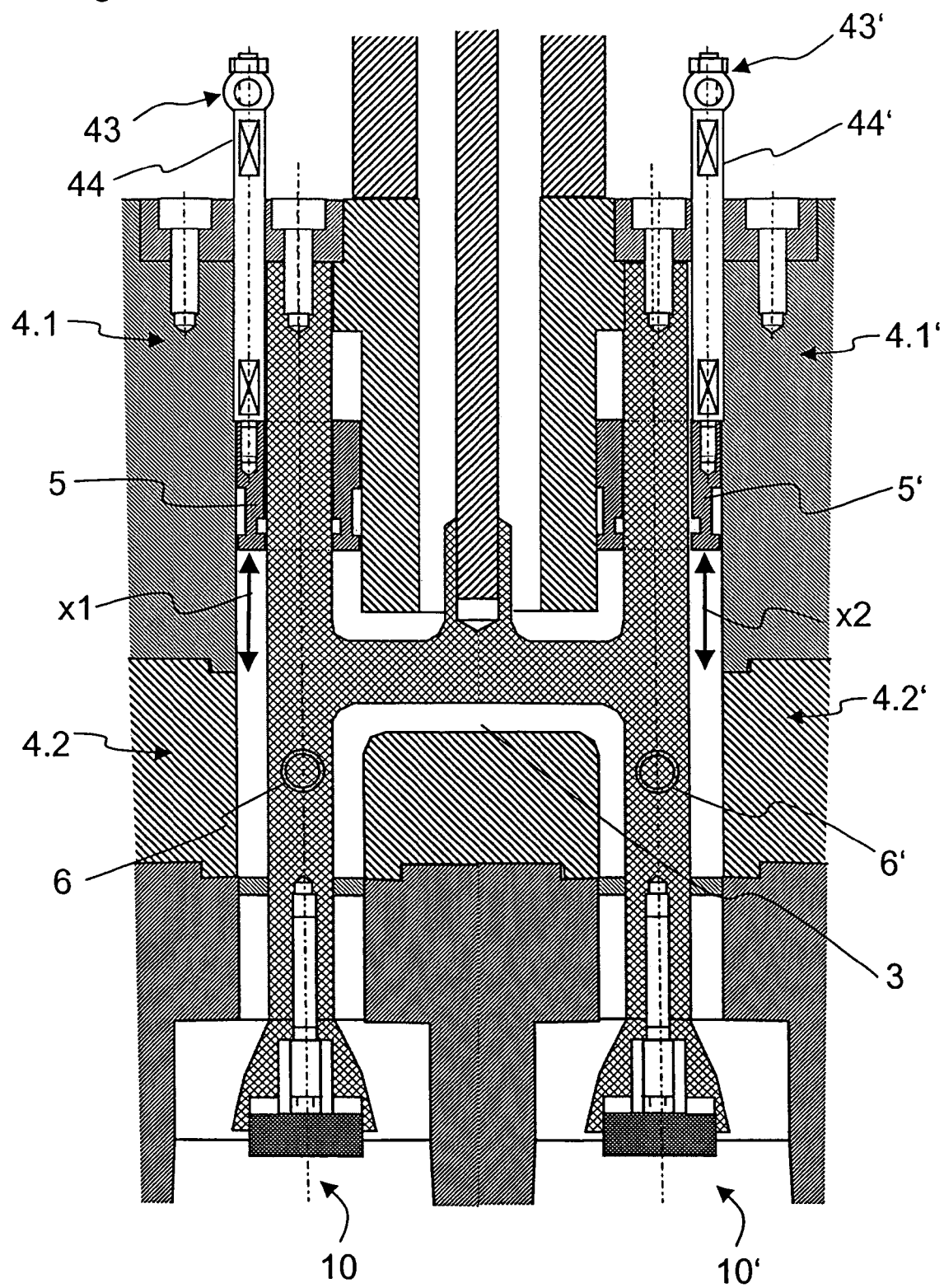
FIG. 2 shows a detailed view of an implementation in accordance with FIG. 1, FIG. 3A diagrammatically depicts an excerpt from a further embodiment of a PICVD coating installation, in which the microwave energy is divided by means of an impedance structure.

FIG. 2 shows how this can be implemented in practice. The figure once again shows the coaxial conductor structure, and at the same time also the geometric structure in the form of an H.

It can also be seen that the two limb sections 4.1, 4.1' are in each case surrounded by sleeves 5, 5'. These sleeves can be displaced along the limb sections. This makes it possible to change the electrical length of the conductor structure. The change differs from limb section to limb section, so that in this way it is possible to influence the coating quality of the coating chambers 10, 10'. The displacement of the sleeves 5, 5' along the limb sections 4.1 or 4.1', respectively, is in this embodiment effected by means of an adjustment device 43 or 43', respectively, which in each case comprises an adjustment screw 44 or 44', respectively, connected to the sleeves 5, 5', respectively.

The adjustment of the sleeves also results in different parameters x for the two limbs 4 and 4' if the sleeves are set differently; these different parameters x are referred to below as x1 and x2. For optimized setting of the apparatus, however, the values of the parameters x1 and x2 will generally only differ to an extent which is such that the difference between the parameters compensates for minor differences in the impedances of the two paths of the impedance structure. To allow a uniform parameter x to be given, therefore, the mean of the parameters x1 and x2 can be taken to give x with a good level of accuracy, $x=\frac{1}{2}(x1+x2)$.

Furthermore, it is also possible to have an influence by screwing screws 6, 6' to a greater or lesser depth into the limbs 4, 4', in this case into the limb sections 4.2, 4.2'.

Although not illustrated here, it will be understood that the input conductor section 2 may also be assigned a sleeve, corresponding to the two sleeves 4.1, 4.1', or a screw, corresponding to the two screws 6, 6', or both of these means.

The following applies to the coaxial conductor structure which is illustrated here by way of example: for given inner conductor diameters, reflection-free matching is only achieved with very specific outer conductor diameters and very specific ratios of the parameter x to parameter y.

In particular, it has been found that substantially reflection-free matching can be achieved if the parameter y is a multiple of half the wavelength of the electromagnetic waves used, i.e. if the relationship $y=n\lambda/2$, $n \in [1, 2, 3, \ldots]$ is substantially satisfied. To achieve satisfactory results for the power division in the impedance structure, therefore, certain restrictions are imposed on the dimensions of the apparatus. Even at a frequency of 2.45 GHz, the wavelength in a coaxial conductor is still more than 12 cm, and consequently if this frequency and structure are used, the distance y can only be selected as an integer multiple of approximately 6 cm. Moreover, the wavelength is also contingent on whether a coaxial conductor or a waveguide is used. In the case of the coaxial conductor, the wavelength is close to the vacuum wavelength. In the case of an R26 waveguide structure, the wavelength at 2.45 GHz is, for example, approximately 17.4 cm, so that in this case for optimum setting y should be approximately 8.7 cm.

Sometimes, even lower frequencies are selected for CVD technology, so that the corresponding wavelengths become even greater. A lower frequency is likewise used in PICVD technology for certain applications, such as for example for large-area coatings, in order to achieve particularly uniform coatings. Accordingly, as the wavelength increases, the associated design restrictions on the coating apparatus also become greater.

However, it has been found that these restrictions can be avoided if the impedance structure has a further limb. Embodiments of this type are illustrated in FIGS. 3A to 3D. In the embodiments shown with reference to FIGS. 3A to 3D, as in the exemplary embodiments explained with reference to FIGS. 1 and 2, the microwave energy from the single microwave source is divided in the impedance branch.

Figure 3A:
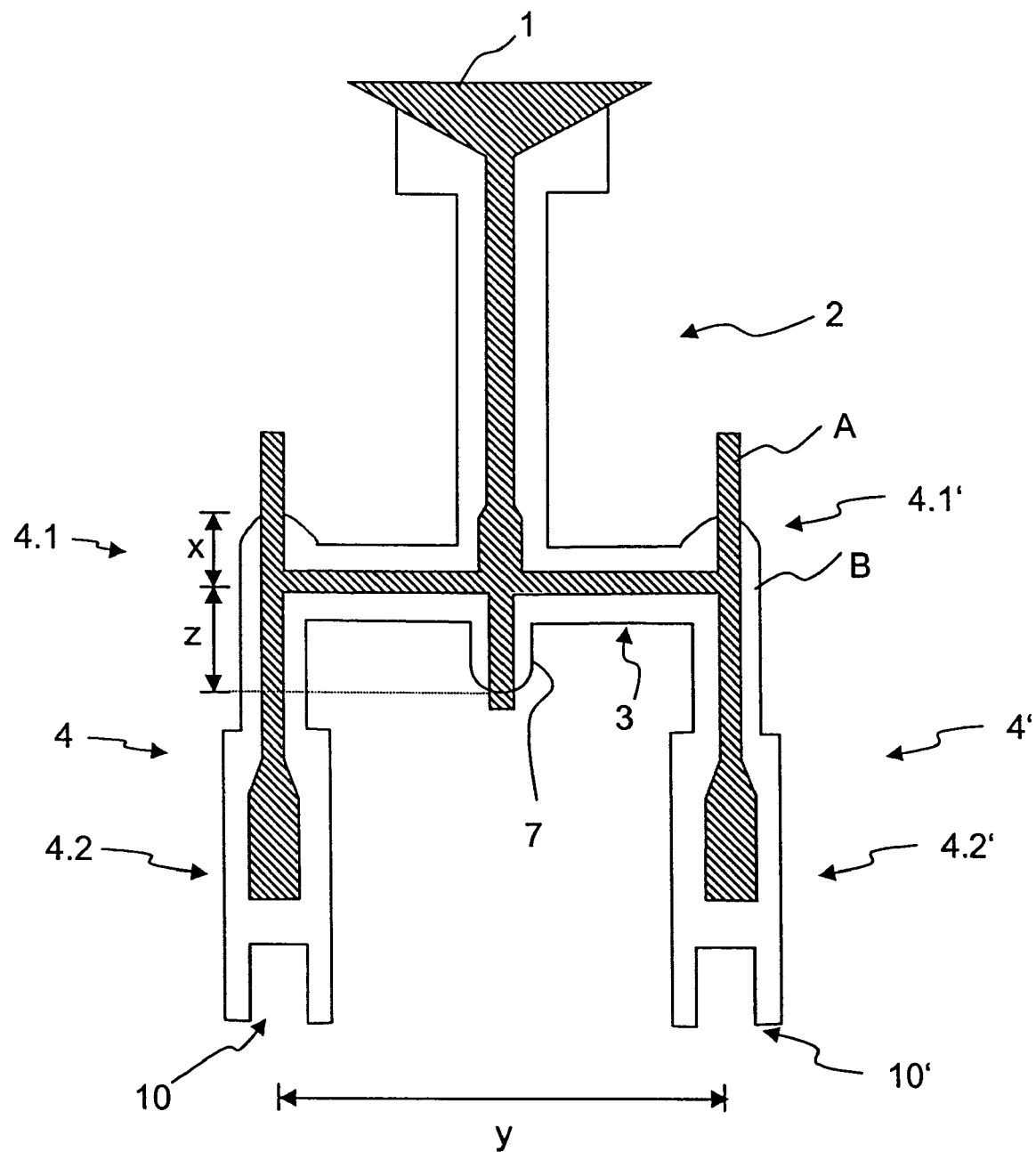
FIG. 3B shows a detailed view of an implementation of the embodiment shown in FIG. 1, FIG. 3C diagrammatically depicts an excerpt from yet another embodiment of a PICVD coating installation, in which the microwave energy is divided by means of an impedance structure with waveguides.
FIG. 3D shows a detailed view of an implementation of the embodiment shown in FIG. 3C.
Figure 3B:
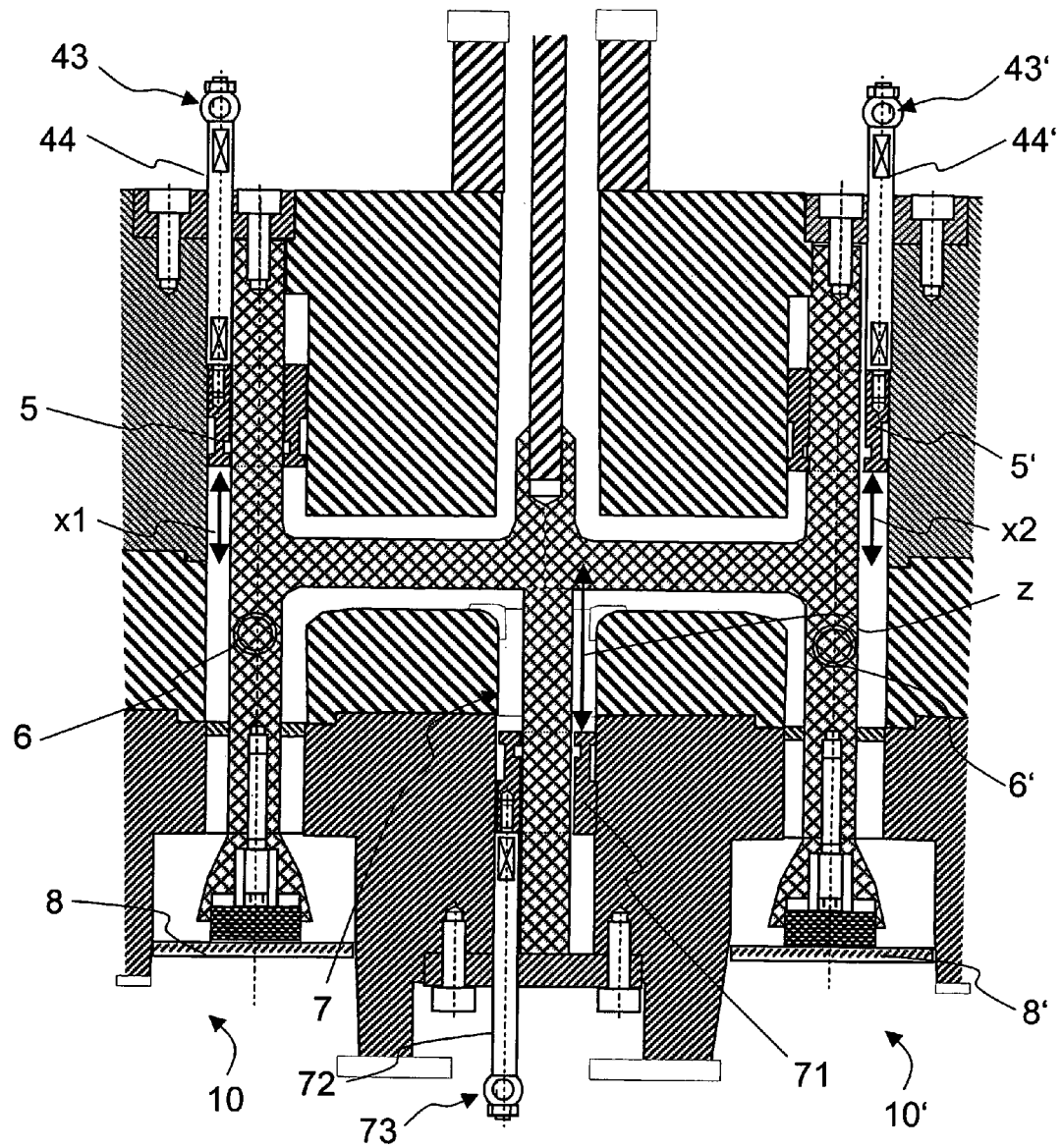

The apparatus illustrated in FIGS. 3A and 3B likewise comprises a coaxial structure having an inner conductor A and an outer conductor B. The inner conductor A preferably consists of metal, and the outer conductor B is a dielectric, for example an air gap, delimited by a conducting surface.

The microwave energy from a microwave source which has been divided by the impedance structure is used to supply the treatment chambers 10 and 10'.

As in the embodiment described above, an H-shaped conductor structure with a web 3 and two limbs 4, 4' is connected to the conductor 2. In contradistinction to the embodiments described above, the impedance structure has a further limb 7, which is connected to the web 3.

The limb 7 defines a parameter z which represents the length of the gap filled with the dielectric B starting from the center of the web 3. In this embodiment, the limb, like the conductor 2, is attached to the center of the web 3 between the two limbs 4 and 4'.

Furthermore, the limb 7 is arranged opposite the conductor 2 with respect to the web 3, so that limb 7 and conductor 2 are aligned. However, this arrangement is not imperative. It is also possible for limb 7 and conductor 2 to extend in two directions which lie at an angle to one another, for example an angle of approximately 90°. In an embodiment of this nature, conductor 2, web 3 and limb 7 then extend in three directions which are substantially perpendicular to one another.

FIG. 3B shows details of the embodiment with an additional limb 7 illustrated in FIG. 3A. The coaxial conductor structure has the geometric structure in the form of an H with an additional limb 7 on its cross-bar.

The two limb sections 4.1, 4.1' and the limb 7 are in each case surrounded by sleeves 5, 5' and 71 which can be displaced along the limb sections 4.1,4.1' or the limb 7 by means of adjustment devices 43, 43', 73. As in the embodiment shown with reference to FIGS. 1 and 2, the electrical length of the limb sections 4.1,4.1' can be altered independently by means of the adjustment devices 43 and 43', respectively. In this embodiment, it is also possible to set the electrical length of the limb 7 independently of the other settings by means of the adjustment device 73. This allows the parameters x1, x2 and z to be set individually and allows uniform division of the microwave power to be achieved.

Figure 3C:
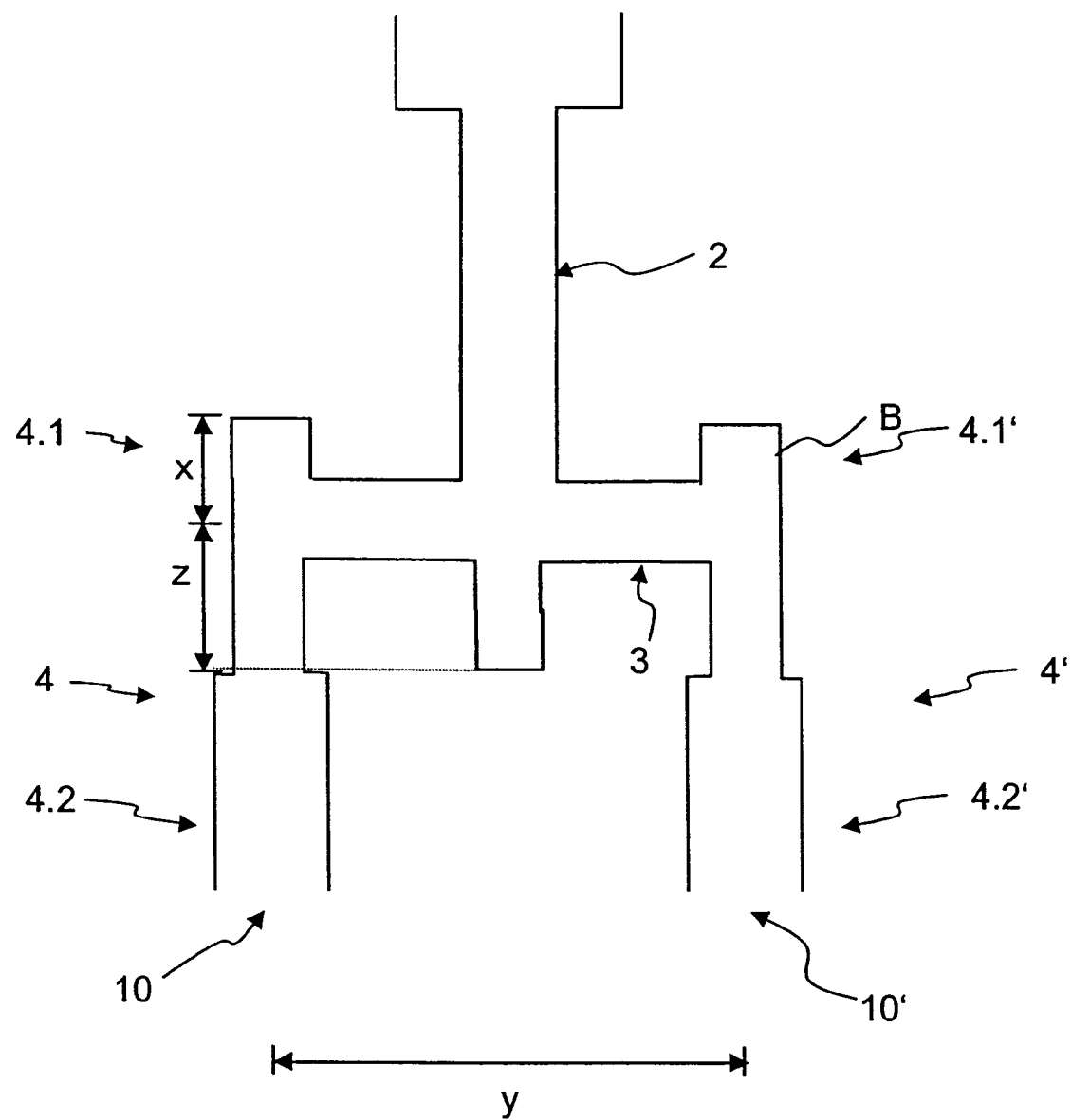
Figure 3D:
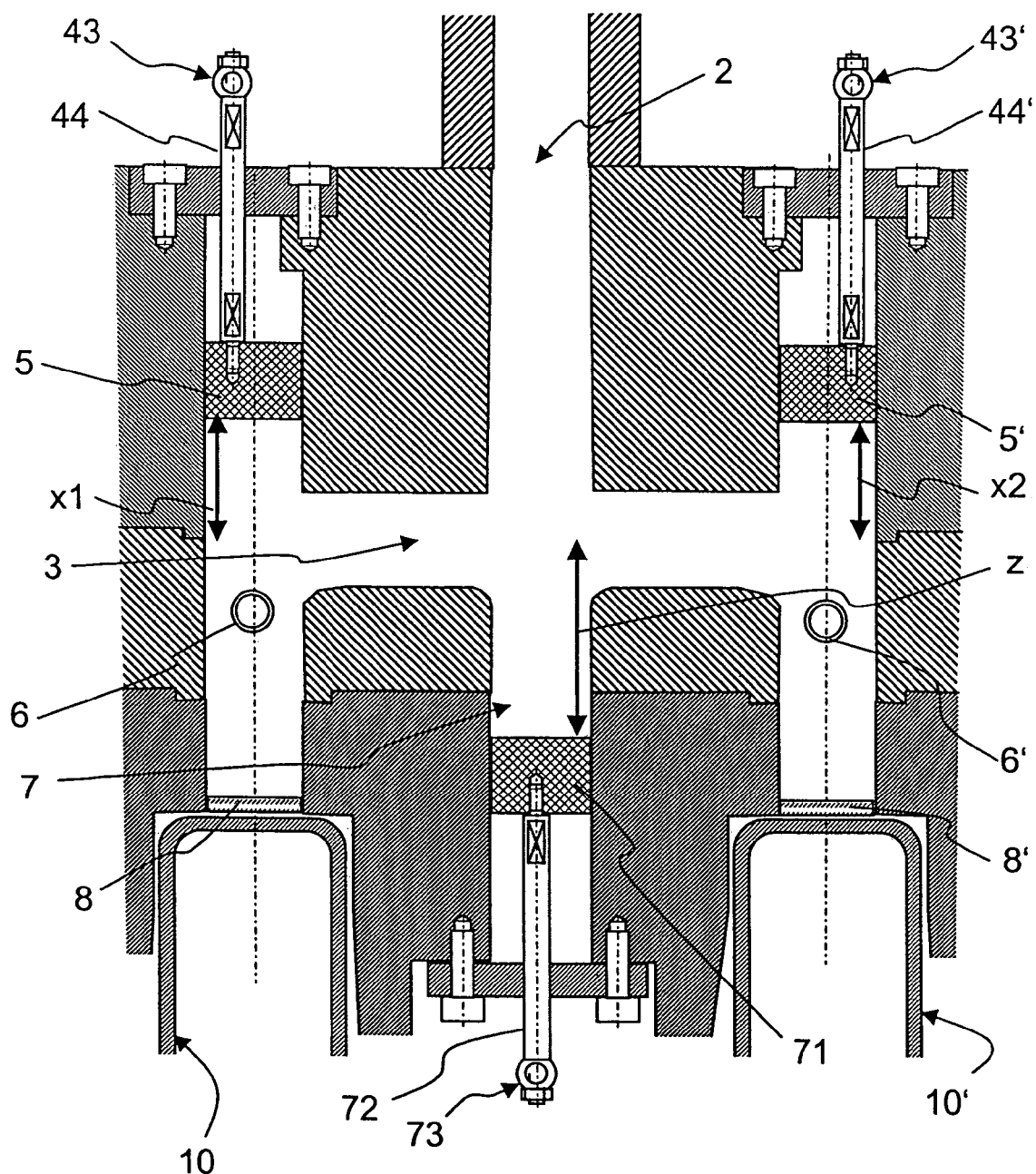

FIGS. 3C and 3D illustrate a variant of the embodiment shown with reference to FIGS. 3A and 3B. In this variant, the impedance structure comprises waveguides instead of the coaxial conductors as shown in FIGS. 3A and 3B. The waveguides may comprise both circular and rectangular waveguides. Such a variant with waveguides is suitable in particular for relatively high frequencies.

In this variant too, the parameters x1, x2 and z can be adjusted and optimized by means of sleeves 5, 5' and 71 which can be displaced along the sections 4.1, 4.1' and the limb 7, respectively.

The coating chambers 10 and 10' may for example, as illustrated in FIG. 3D, be formed by the work pieces which are to be coated. In this case, FIG. 3D in each case shows the base region of an ampoule which has been coupled to the conductor structure and through which the microwaves pass into the interior of the ampoule. In addition to ampoules, it is also possible for other work pieces in the form of hollow bodies, such as for example vials, bottles or spherical caps, to be internally coated, or alternatively it is also possible for other work pieces, such as for example lamp bulbs, to be externally coated in separate chambers. In this case too, the supply conductors to the coating chambers 10, 10', or the impedance structure, in particular the conductor 2 and the H-shaped conductor structure, are designed as fixed or rigid conductors.

As illustrated in FIGS. 3B and 3D, in all embodiments it is also possible for the microwaves to be introduced into the coating chambers 10, 10' via dielectric windows 8, 8'. This prevents a plasma from being ignited in the impedance structure or waveguide structure, since the penetration of process gas is avoided or it is possible to maintain a pressure at which a plasma does not ignite.

Figure 4A:
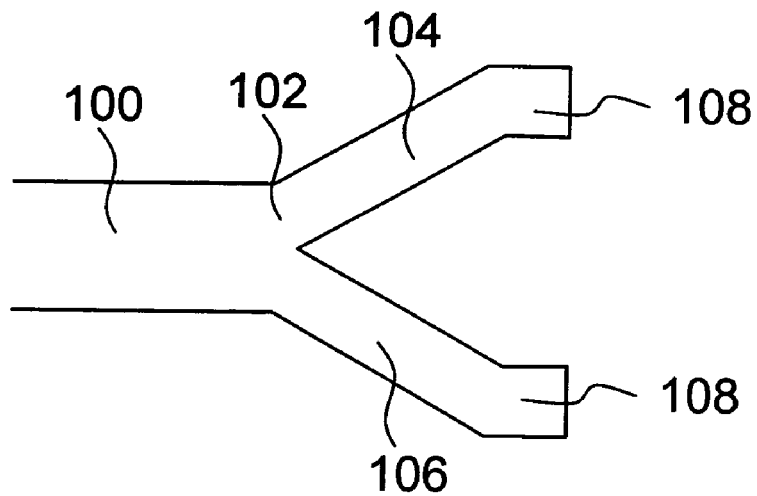
FIG. 4A shows a waveguide with a y-divider for dividing the microwave energy into two branches.
Figure 4B:
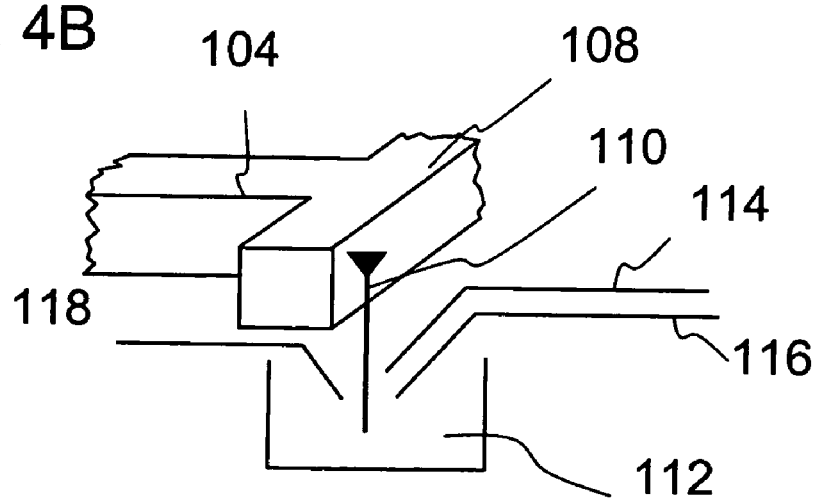
FIG. 4B shows a view of a rectangular waveguide with coaxial conductor for releasing the microwave energy into individual coating chambers.
Figure 5:
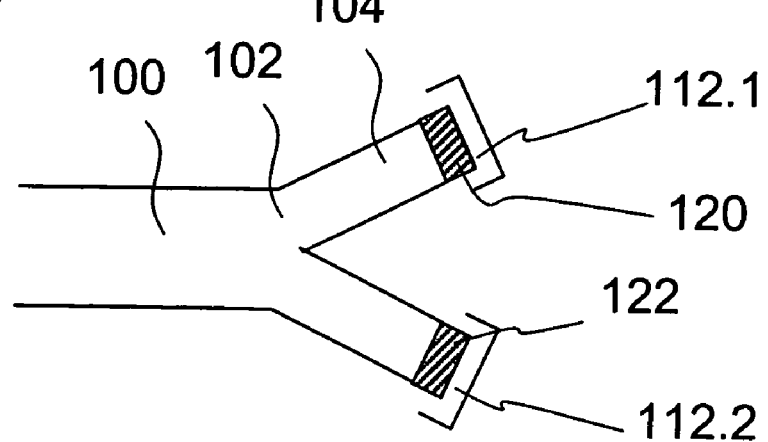
FIG. 5 shows a view of a rectangular waveguide with dielectric windows for releasing the microwave energy into individual coating chambers.

FIGS. 4A and 4B and also FIG. 5 show embodiments of the invention in which the dividing of the microwave energy, which is generated by a microwave source (not shown), is performed while it is still in the waveguide 100. All the microwave energy from the microwave source is introduced into the waveguide 100, for example a rectangular waveguide, and is divided into two parts in the region 102 in the embodiment illustrated. One part of the microwave energy is fed to the rectangular waveguide 104, and one part of the energy is fed to the rectangular waveguide 106. The microwave energy which has been introduced into the branches 104 and 106 is transmitted to the rectangular waveguide 108. In the rectangular waveguide 108, as illustrated in FIG. 4B, the microwave energy is introduced via coaxial conductors 110 into the individual coating chambers 112, which in the present case may be the actual 3D containers which are to be coated. Examples of 3D containers which can be coated using the present process include spherical caps, syringes, ampoules, bottles, vials, catheters. For the invention, it is important for each 3D container 112 to have a dedicated vacuum supply 114 and a dedicated gas supply 116. The dedicated supply devices allow the individual coating chambers of the multistation coating system to be operated or controlled separately, i.e. individually.

It is particularly advantageous if the individual coating chambers also have separate plasma-monitoring devices 118 for detection of thermal and/or electromagnetic emission originating from the plasma or the substrate which is to be coated, so that each individual coating chamber can be individually operated in pulsed mode.

In addition to energy being introduced by means of coaxial conductors, as shown in FIG. 4B, it is also possible, as illustrated in FIG. 5, for the energy of the individual branches 104 and 106 of the divided waveguide to be introduced into the individual coating chambers 112.1 and 112.2 by means of what are known as dielectric windows.

Combinations of the embodiments illustrated are also possible.

Figure 6:
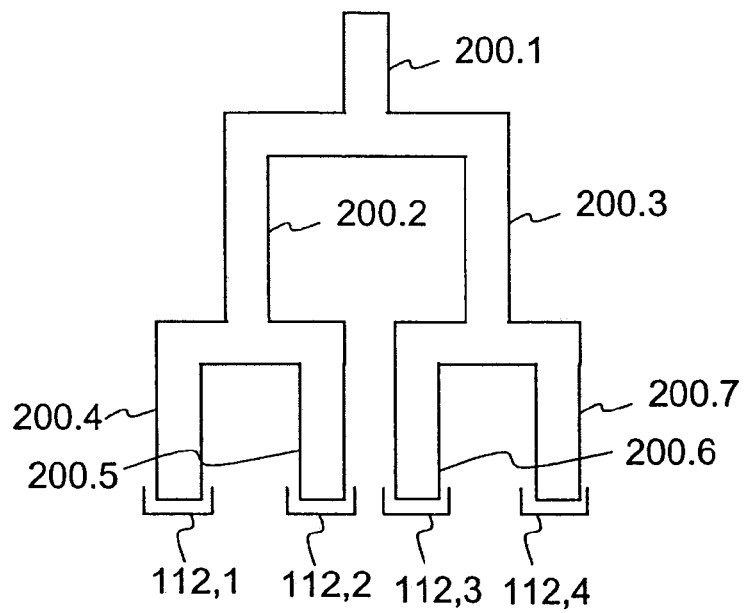
FIG. 6 shows a system of coaxial conductors or waveguides for supplying more than two coating stations.
Figure 7:
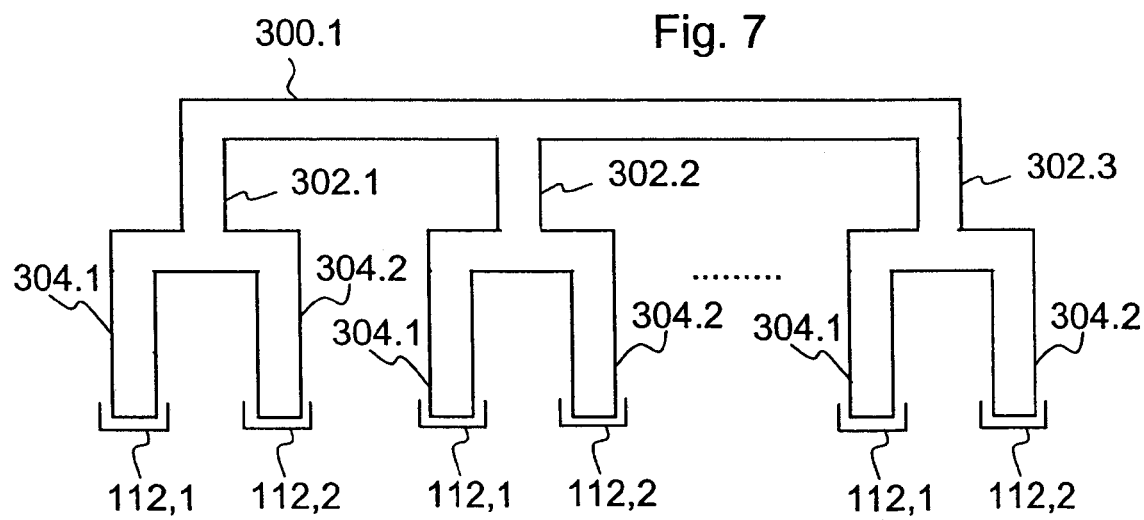
FIG. 7 shows an alternative implementation of a system shown in FIG. 6.

FIGS. 6 and 7 show examples of the invention which allow more than two coating stations to be realized. This is possible both with the aid of coaxial conductors and with the aid of waveguides.

In the embodiment shown in FIG. 6, a first coaxial conductor 200.1 is divided into two coaxial conductors 200.2, 200.3 in accordance with the invention. The coaxial conductors 200.2, 200.3 are in turn divided into two coaxial conductors or waveguides 200.4, 200.5 and 200.6, 200.7 in the style of a branched cascade. The individual coating chambers 112.1, 112.2, 112.3, 112.4 are located at the end of the branched cascade.

As an alternative to a cascade-like configuration as shown in FIG. 6, it would also be conceivable for a multiplicity of double stations 302.1, 302.2, 302.3, each of which comprises two rectangular waveguides or two coaxial conductors 304.1, 304.2, to be connected to a common waveguide 300.1. A coating chamber 112.1, 112.2 is arranged beneath each corresponding coaxial conductor or waveguide 304.1, 304.2.

The invention for the first time proposes an apparatus for coating objects which makes it possible for a plurality of coating chambers to be operated using a single microwave source.

The invention allows pulsed or alternatively unpulsed microwave energies to be used, by suitable division, to supply a plurality of separate coating stations with energy. For reasons of coating technology, for example to prevent adjacent coating stations from influencing one another, the stations remain separated from one another but are supplied with an energy source. The invention makes it possible to ensure that alternating ignition, i.e. the uncontrolled ignition of one chamber or another, does not occur, but rather all the chambers are ignited simultaneously and the same energy supply is maintained throughout the duration of coating.

It has been found that the plasma volume and the gas composition are not at all critical in the apparatus according to the invention. The apparatus made it possible to produce both internal coatings with plasma volumes of between 2 and 10 ml for the coating of ampoules, internal coatings of spherical caps with plasma volumes of approximately 50 ml, and external coatings of light bulbs with plasma volumes of up to 100 ml without the process parameters having to be readjusted. A significant change in the impedance is associated with the change in the plasma volume. Furthermore, for the different plasma volumes it was also possible to use different gas compositions, in particular including gas compositions with different precursors, such as for example hexamethyldisiloxane or titanium chloride, in each case with different concentrations, without significantly altering the plasma properties and coating quality; the gas composition also has a considerable influence on the impedance.

The invention claimed is:

1. An apparatus for coating objects, comprising:
    a single microwave source;
    two or more coating chambers, the two or more coating chambers being connected to the single microwave source;
    a structure for dividing microwave energy from the single microwave source in order to generate plasmas in each of the two or more coating chambers; and
    an H-shaped coaxial conductor structure having a web and two limbs, the H-shaped conductor being connected upstream of the two or more coating chambers, the web being connected to the single microwave source via an input conductor, and said web being connected to each of the two limbs so as to divide each of the two limbs into a first section remote from the two or more coating chambers and a second section which faces the two or more coating chambers.

2. The apparatus as claimed in claim 1, wherein the structure comprises a waveguide structure comprising at least one component for dividing the microwave energy.

3. The apparatus as claimed in claim 2, wherein the at least one component for dividing the microwave energy is a y-divider.

4. The apparatus as claimed in claim 2, wherein the waveguide structure comprises a rectangular waveguide.

5. The apparatus as claimed in claim 2, wherein the waveguide structure comprises circular waveguides.

6. The apparatus as claimed in claim 2, wherein the waveguide structure comprises dielectric windows or coaxial conductor structures for introducing the microwave energy into the two or more coating chambers, respectively.

7. The apparatus as claimed in claim 1, wherein the structure comprises an impedance structure comprising at least one component for dividing the microwave energy.

8. The apparatus as claimed in claim 7, wherein the impedance structure comprises a coaxial conductor structure for each of the two or more coating chambers, the coaxial conductor structure comprising a metallic inner conductor and a dielectric as an outer conductor.

9. The apparatus as claimed in claim 8, further comprising means for altering an electrical length of the metallic inner conductors.

10. The apparatus as claimed in claim 8, wherein the coaxial conductor structure comprises a first conductor section connecting the single microwave source and a branching point.

11. The apparatus as claimed in claim 1, wherein the first section has an adjustable electrical length.

12. The apparatus as claimed in claim 11, wherein the input conductor has an adjustable electrical length.

13. The apparatus as claimed in claim 12, wherein the means for adjusting the electrical length are formed from a displaceable sleeve which surrounds the input conductor.

14. The apparatus as claimed in claim 12, wherein the means for adjusting the electrical length of the metallic inner conductor is a screw which can be screwed into the metallic inner conductor.

15. The apparatus as claimed in claim 1, wherein the web is connected to a further limb.

16. The apparatus as claimed in claim 15, wherein the further limb is connected to the web substantially in the center of the web between the two limbs.

17. The apparatus as claimed in claim 15, wherein the further limb has an adjustable electrical length.

18. The apparatus as claimed in claim 1, wherein the two or more coating chambers are shielded from one another.

19. The apparatus as claimed in claim 1, wherein each of the two or more coating chambers can accommodate an object to be coated.

20. The apparatus as claimed in claim 1, further comprising separate vacuum and gas supply devices for each of the two or more coating chambers.

21. The apparatus as claimed claim 1, further comprising separate detection units for each of the two or more coating chambers, the separate detection units for recording thermal and/or electromagnetic emission originating from the plasma or the substrate to be coated.

22. The apparatus as claimed in claim 1, further comprising a pulsed microwave source.

23. The apparatus as claimed in claim 1, wherein the structure comprises rigid conductors.

24. An apparatus for coating objects, comprising:
a single microwave source for generating microwave energy;
a waveguide structure having a web and two limbs, each limb having an upper limb section and a lower limb section, the web being connected to the single microwave source so that the microwave energy is divided to the two limbs and is divided to the upper and lower sections; and
two coating chambers, each coating chamber of the two coating chambers being connected to the lower limb section of one of the two limbs so that the microwave energy from the single microwave source can generate plasma in the two coating chambers.

25. The apparatus as claimed in claim 24, further comprising a sleeve surrounding the upper limb section of each of the two limbs, the sleeves being separately moveable along the upper limb section to adjust an electrical length of the waveguide structure.

* * * * *